US008199270B2

(12) United States Patent
Liu et al.

(10) Patent No.: US 8,199,270 B2
(45) Date of Patent: Jun. 12, 2012

(54) TFT-LCD ARRAY SUBSTRATE AND METHOD OF MANUFACTURING THE SAME

(75) Inventors: Xiang Liu, Beijing (CN); Seung Moo Rim, Beijing (CN); Xu Chen, Beijing (CN); Zhenyu Xie, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 267 days.

(21) Appl. No.: 12/648,480

(22) Filed: Dec. 29, 2009

(65) Prior Publication Data
US 2010/0165227 A1 Jul. 1, 2010

(30) Foreign Application Priority Data
Dec. 30, 2008 (CN) .......................... 2008 1 0247594

(51) Int. Cl.
G02F 1/136 (2006.01)
(52) U.S. Cl. .......................................................... 349/43
(58) Field of Classification Search ...................... 349/43
See application file for complete search history.

(56) References Cited

U.S. PATENT DOCUMENTS
6,057,896 A 5/2000 Rho et al.
2007/0246707 A1 10/2007 Deng et al.
2009/0141203 A1* 6/2009 Son et al. .......................... 349/39
2009/0174835 A1* 7/2009 Lee et al. .......................... 349/46
2011/0242464 A1* 10/2011 Kawasaki ....................... 349/106

FOREIGN PATENT DOCUMENTS
CN 1183570 A 6/1998
CN 101060123 A 10/2007

* cited by examiner

Primary Examiner — Timothy L Rude
(74) Attorney, Agent, or Firm — Ladas & Parry LLP

(57) ABSTRACT

The present invention relates to a method of manufacturing an array substrate of TFT-LCD. The method includes the following steps. In step 1, a gate metal thin film is deposited on a substrate and patterned into gate electrodes and gate lines by a first patterning process. In step 2, a gate insulation layer, a semiconductor layer and a barrier layer are subsequently deposited on the resultant structure of step 1 and are patterned into gate insulation layer pattern, semiconductor layer pattern and barrier layer pattern by a second patterning process, wherein the barrier layer is used for preventing the semiconductor layer at the TFT channel from being etched. In step 3, an ohmic contact layer, a transparent conductive layer, a source drain metal layer and a passivation layer are subsequently deposited on the resultant structure of step 2, and are patterned into ohmic contact layer pattern, pixel electrodes, data lines, source electrodes, drain electrodes and passivation layer pattern in a patterning process.

10 Claims, 15 Drawing Sheets

TFT-LCD ARRAY SUBSTRATE AND METHOD OF MANUFACTURING THE SAME

BACKGROUND

The embodiments of present invention relate to a thin film transistor liquid crystal display (TFT-LCD), particularly to an array substrate of thin film transistor liquid crystal display and the method of manufacturing the same.

TFT-LCD plays a dominant role in current flat screen display market, due to its excellent characteristics such as small volume, low power consumption and free of radiation. For TFT-LCD, array substrate and the manufacture process thereof significantly affect the performance, yield and price of a display product.

In order to effectively lower the price of TFT-LCD and improve product yield, the manufacture process of TFT-LCD array substrate becomes more and more simplified, from an original 7 masks process to current 4 masks process based on slit photolithographic technology.

In a conventional 4 masks process, a gray or halftone mask is used to complete the manufacture of an active layer, data lines, source electrodes, drain electrodes and TFT channel regions in a single patterning process. The process is described in more detail as following. Firstly, gate lines and gate electrodes are formed in a first patterning process. Then, a gate insulation layer, a semiconductor layer, a doped semiconductor layer (ohmic contact layer) and a source drain metal layer are subsequently deposited on a substrate having the gate lines and gate electrodes formed thereon. Next, data lines, an active layer, source drain electrodes and TFT channel regions are patterned with a gray or halftone mask through wet etching and a multi-steps etching process (etching the semiconductor layer→ashing→dry etching→etching the doped semiconductor layer) in a second patterning process using slit photolithograph. Next, a passivation layer is deposited and patterned to form through holes therein in a third patterning process. Finally, a transparent conductive layer is deposited and patterned into pixel electrodes in a fourth patterning process.

In the above conventional method, in order to completely remove the ohmic contact layer at the TFT channel region by dry etching while satisfying the requirement for the uniformity of the deposited film and the uniformity of etching, it is often necessary to perform over etching so as to remove a part of the underlying semiconductor layers. Thus, the semiconductor layer must be made thicker with a thickness of 100-300 nm. The off-state current of the TFT can be calculated as following:

$$I_{off} = q(n\mu_e + p\mu_p)\frac{Wds}{L}V_{ds},$$

in which q is electron charge, n is electron density, p is hole density, $\mu_e$ is electron mobility, $\mu_p$ is hole mobility, W is TFT channel width, L is TFT channel length, ds is thickness of the active layer at TFT channel and $V_{ds}$ is potential difference between the source electrode and the drain electrode. According to the above equation, the off-state current of the TFT increases as the thickness of the active layer increases, thus reducing the retention time of the charge at the pixel electrode and directly affecting the performance of the TFT. Moreover, the contact resistance between the ohmic contact layer and the TFT channel increases with thicker active semiconductor layer, and thus decreasing the conductivity.

SUMMARY

In an aspect, an embodiment of present invention provides an array substrate of TFT-LCD comprising gate lines and data lines. Pixel electrodes and thin film transistors are formed within the pixel regions defined by the gate lines and the data lines. A barrier layer is disposed between a semiconductor layer and an ohmic contact layer in the thin film transistor for preventing the semiconductor layer from being etched. The area of barrier layer is smaller than the area of the semiconductor layer, so that the ohmic contact layer can be in contact with the semiconductor layer.

In another aspect, an embodiment of present invention provides a method of manufacturing an array substrate of TFT-LCD comprising the following steps.

In step 1, a gate metal thin film is deposited on a substrate and patterned into gate electrodes and gate lines in a first patterning process;

In step 2, a gate insulation layer, a semiconductor layer and a barrier layer are subsequently deposited on the resultant structure of step 1 and are patterned into gate insulation layer pattern, semiconductor layer pattern and barrier layer pattern in a second patterning process, in which the barrier layer is used for preventing the semiconductor layer at the TFT channel from being etched;

In step 3, an ohmic contact layer, a transparent conductive layer, a source drain metal layer and a passivation layer are subsequently deposited on the resultant structure of step 2, and are patterned into ohmic contact layer pattern, pixel electrodes, data lines, source electrodes, drain electrodes and passivation layer pattern in a third patterning process.

In a four patterning process according to the embodiments of the present invention, a barrier layer is disposed between the semiconductor layer and the ohmic contact layer. Since the area of the barrier layer is smaller than the area of the semiconductor layer, the barrier layer will not affect the contact between the ohmic contact layer and the semiconductor layer. The barrier layer can prevent the semiconductor layer at TFT channel from being etched during etching, thus reducing the thickness of the semiconductor layer and the off-state current, and increasing the retention time of the charge at the pixel electrode, which in turn improves TFT performance.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein:

FIG. 3b is a cross sectional view taken along line A-A in FIG. 3a;

DETAILED DESCRIPTION OF THE PREFERRED EMBODIMENTS

Figure 1:
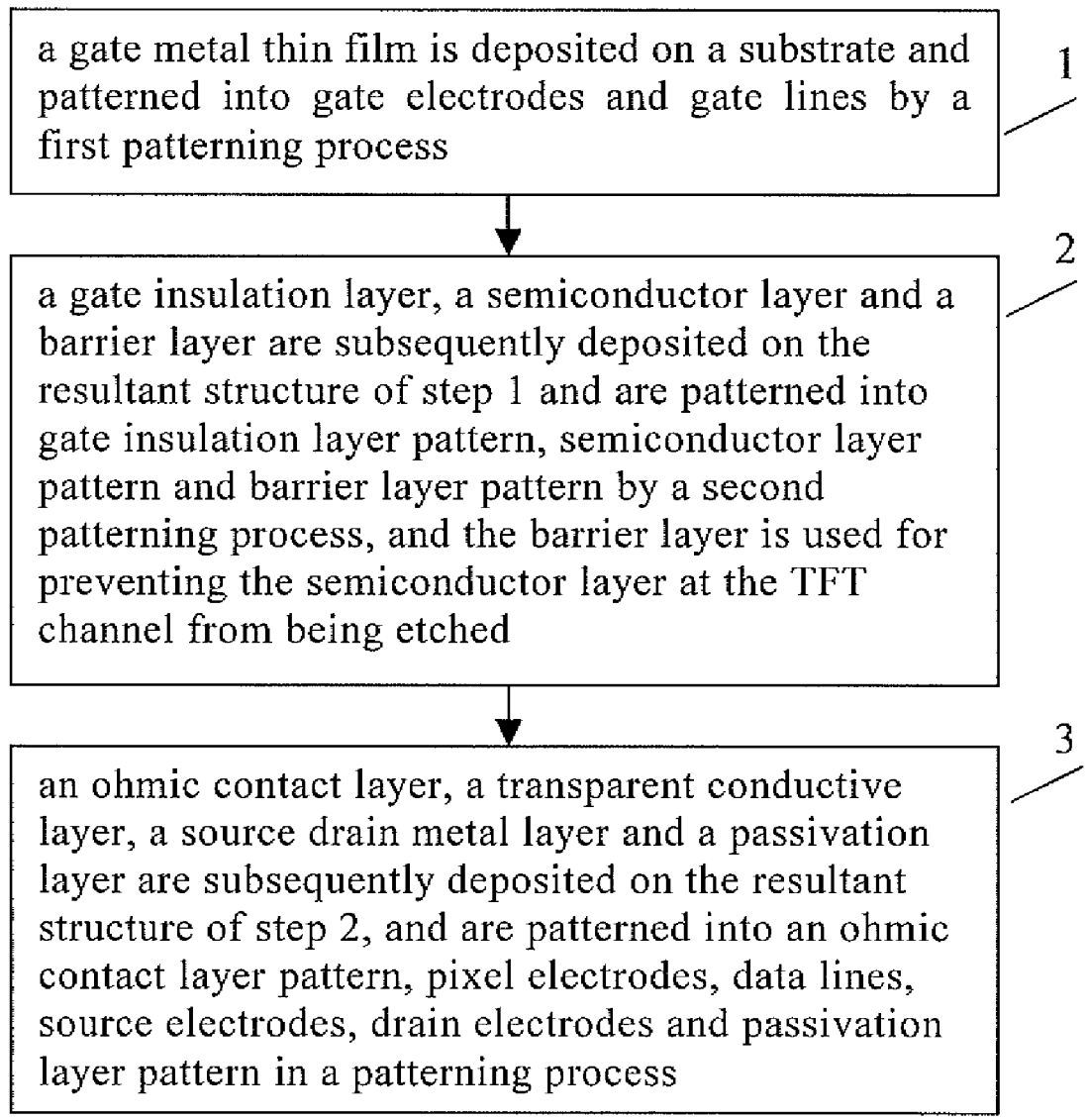
FIG. 1 is a flow chart of a method of manufacture of the array substrate of the TFT-LCD according to an embodiment of the present invention.

FIG. 1 is a flow chart of a method of manufacture of the array substrate of the TFT-LCD according to an embodiment of the present invention. The method includes the following step.

In step 1, a gate metal thin film is deposited on a substrate and patterned into gate electrodes and gate lines by a patterning process.

In step 2, a gate insulation layer, a semiconductor layer and a barrier layer are subsequently deposited on the resultant structure of step 1 and are patterned into gate insulation layer pattern, semiconductor layer pattern and barrier layer pattern by a patterning process, in which the barrier layer is used for preventing the semiconductor layer at the TFT channel from being etched.

In step 3, an ohmic contact layer, a transparent conductive layer, a source drain metal layer and a passivation layer are subsequently deposited on the resultant structure of step 2, and are patterned into ohmic contact layer pattern, pixel electrodes, data lines, source electrodes, drain electrodes and passivation layer pattern in a patterning process.

Figure 2:
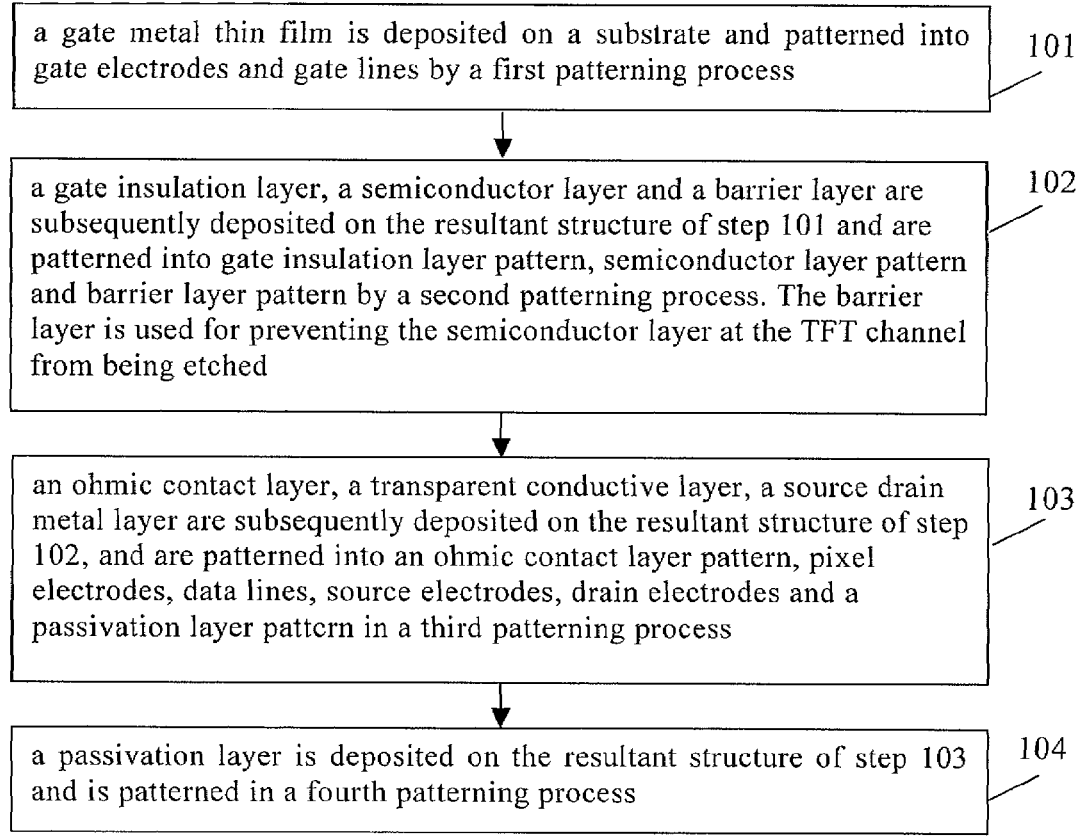
FIG. 2 is a flow chart of a method of manufacture of the array substrate of the TFT-LCD according to a first embodiment of the present invention.

FIG. 2 is a flow chart of a method of manufacture of the array substrate of the TFT-LCD according to a first embodiment of the present invention. The method includes the following steps.

In step 101, a gate metal thin film is deposited on a substrate and patterned into gate electrodes and gate lines by a first patterning process.

In step 102, a gate insulation layer, a semiconductor layer and a barrier layer are subsequently deposited on the resultant structure of step 101 and are patterned into gate insulation layer pattern, semiconductor layer pattern and barrier layer pattern by a second patterning process. The barrier layer is used for preventing the semiconductor layer at the TFT channel from being etched.

In step 103, an ohmic contact layer, a transparent conductive layer, a source drain metal layer are subsequently deposited on the resultant structure of step 102, and are patterned into an ohmic contact layer pattern, pixel electrodes, data lines, source electrodes, drain electrodes in a third patterning process respectively, thus forming TFT channels.

In step 104, a passivation layer is deposited on the resultant structure of step 103 and is patterned in a fourth patterning process.

Figure 3A:
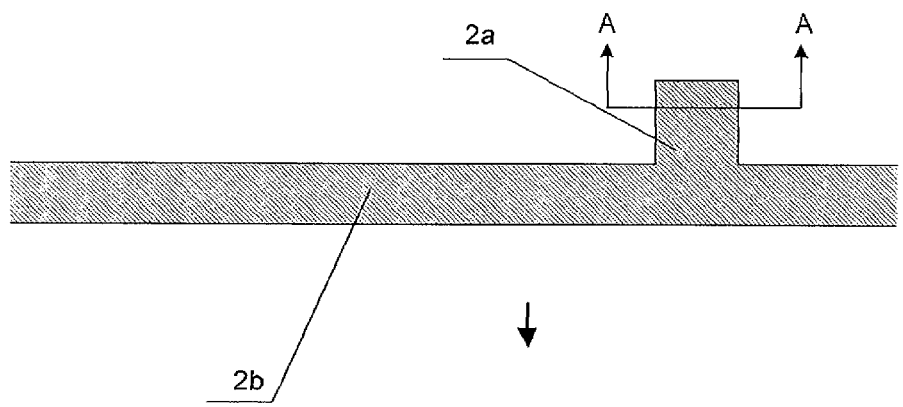
FIG. 3a is a plan view showing an array substrate of the TFT-LCD after a first patterning process according to the first embodiment of present invention.
Figure 3B:
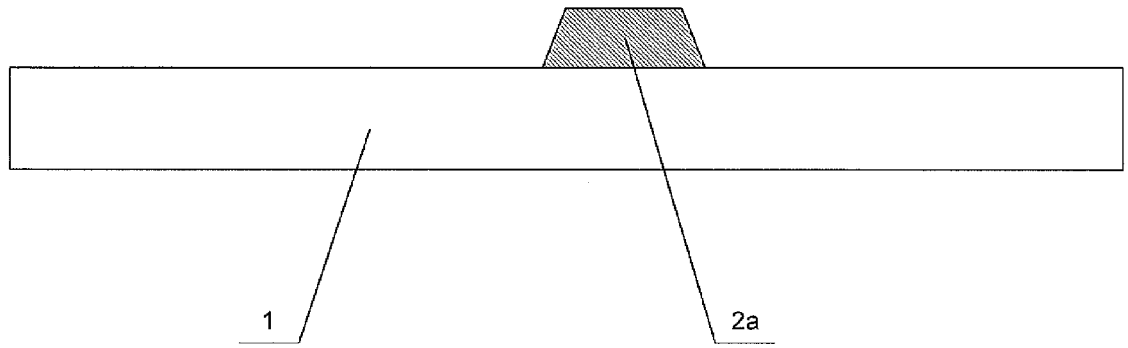

Now, the process flow shown in FIG. 2 will be further described as follows:

In the step 101, the gate metal layer is deposited on a transparent substrate 1 by a sputtering or thermal evaporation process. The transparent substrate 1 can be glass or quartz. The material of the gate metal thin film can be selected from metals such as Cr, W, Ti, Ta, Mo, Al, Cu or alloy thereof, and the gate metal thin film can also be formed of metals with multilayer structure. The gate metal layer is etched by the first patterning process to than gate electrode 2a and gate line 2b in the display region on the substrate 1, as shown in FIGS. 3a and 3b. FIG. 3a is a plan view showing an array substrate of the TFT-LCD after a first patterning process according to the first embodiment of present invention. FIG. 3b is a cross sectional view taken along line A-A in FIG. 3a.

In the step 102, a gate insulation layer 3, the semiconductor layer 4 with a thickness of 40-100 nm and a barrier layer 5 with a thickness of 100-300 nm are subsequently deposited on the resultant structure of step 101 by a plasma enhanced chemical vapor deposition (PECVD) process. The material of the gate insulation layer 3 and the barrier layer 5 can be selected from SiNx, SiOxNx or the composite thereof. The corresponding reaction gas may be selected from a gas mixture of $SiH_4$, $NH_3$ and $N_2$ or a gas mixture of $SiH_2Cl_2$, $NH_3$ and $N_2$. The corresponding reaction gas for depositing the semiconductor layer 4 can be selected from the gas mixture of $SiH_4$, $H_2$ or a gas mixture of $SiH_2Cl_2$, $H_2$. It is noted that if the material of the barrier layer and the gate insulation layer are the same, the gate insulation layer will be etched simultaneously when the barrier layer is etched after removing the photoresist above the barrier layer. Thus, in the embodiments of present invention, the material of the barrier layer and the material of the gate insulation layer are different for the same TFT-LCD array substrate.

Figure 4A:
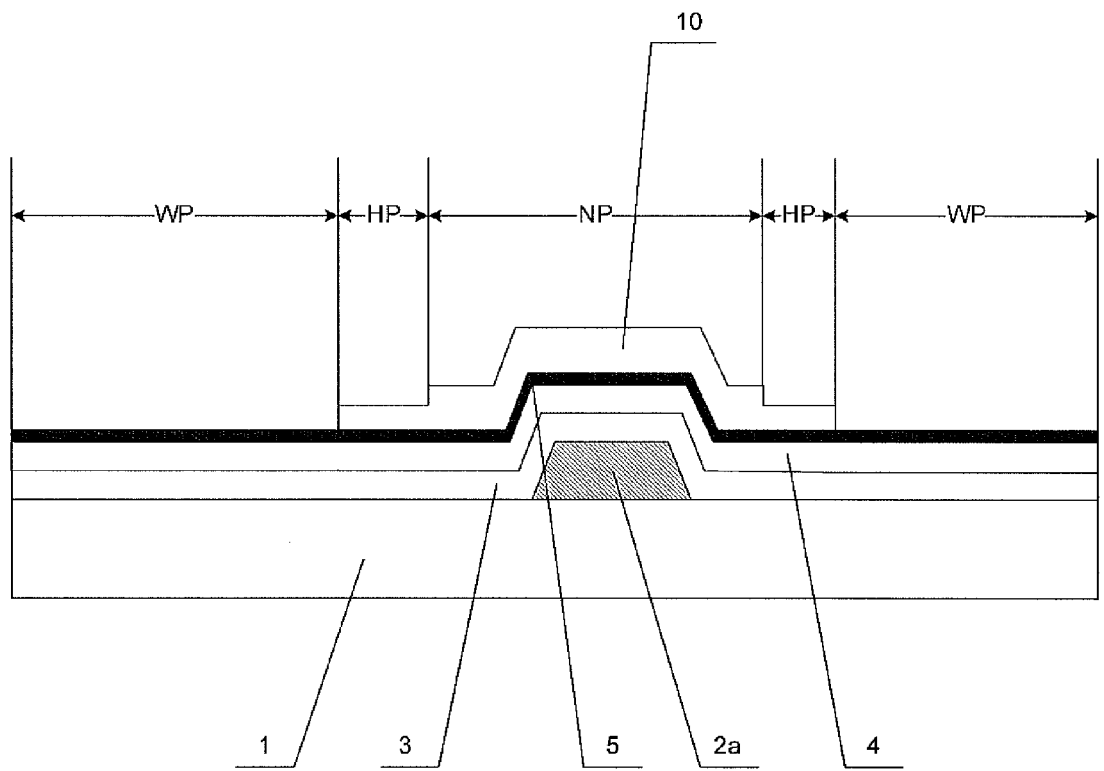
FIG. 4a is a cross sectional view showing the array substrate of the TFT-LCD after exposing and developing using a half tone or gray tone mask in a second patterning process according to the first embodiment of present invention.

The photoresist layer 10 is then applied, and the photoresist 10 is exposed and developed by using a half tone or gray tone mask. FIG. 4a is a cross sectional view showing the array substrate of the TFT-LCD after exposing and developing using the half tone or gray tone mask in a second patterning process according to the first embodiment of present invention. As shown in FIG. 4a, a region WP refers to a region in which the photoresist is completely removed, a region HP refers to a region in which the photoresist is partially remained, and a region NP refers to a region in which the photoresist is kept intact. The region NP corresponds to the region to be formed with the barrier layer pattern, the region WP corresponds to the region on the substrate except for the region to be formed with the semiconductor layer pattern, and the region HP corresponds to the region on the substrate other than the region NP and the region WP.

Figure 4B:
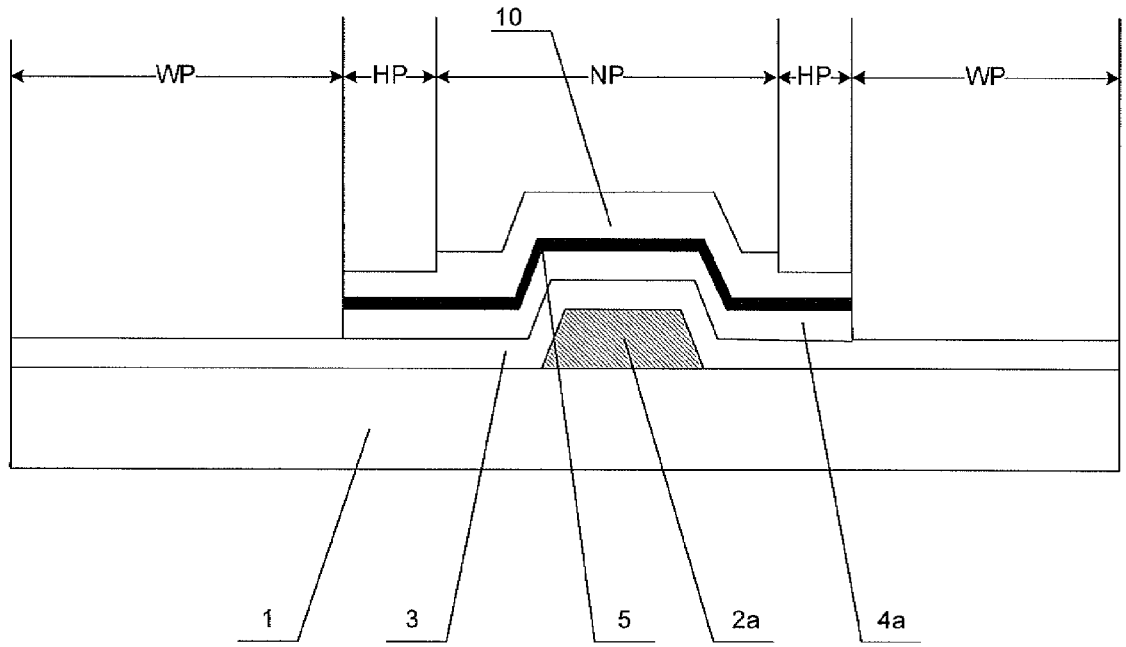
FIG. 4b is a cross sectional view showing the array substrate of the TFT-LCD after a first etching in the second patterning process according to the first embodiment of present invention.

The array substrate shown in FIG. 4a is subjected to a first etching process to remove the barrier layer and the semiconductor layer in the region WP, thus forming the semiconductor layer pattern 4a, as shown in FIG. 4b, which is a cross sectional view showing the array substrate of the TFT-LCD after a first etching in the second patterning process according to the first embodiment of present invention.

Figure 4C:
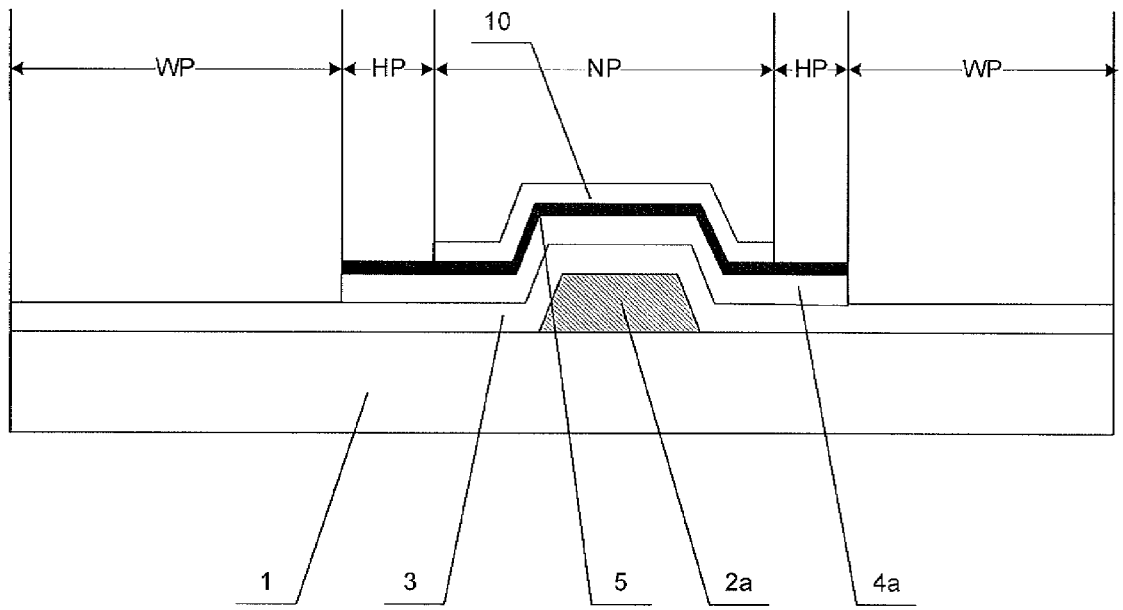
FIG. 4c is a cross sectional view showing the array substrate of the TFT-LCD after ashing in the second patterning process according to the first embodiment of present invention.

Then, the photoresist on the array substrate as shown in FIG. 4b is subjected to ashing so as to remove the photoresist on the region HP, as shown in FIG. 4c which is a cross sectional view showing the array substrate of the TFT-LCD after ashing in the second patterning process according to the first embodiment of present invention.

Figure 4D:
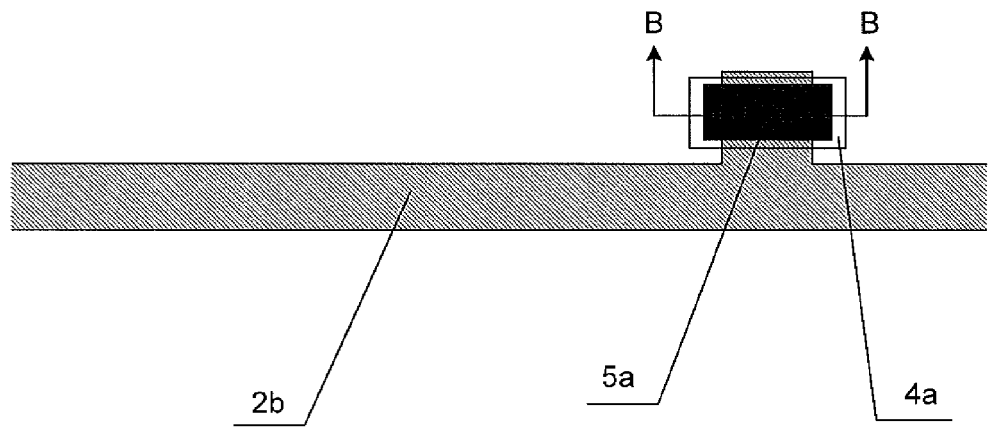
FIG. 4d is a plan view showing the array substrate of the TFT-LCD after the second patterning process according to the first embodiment of present invention.
Figure 4E:
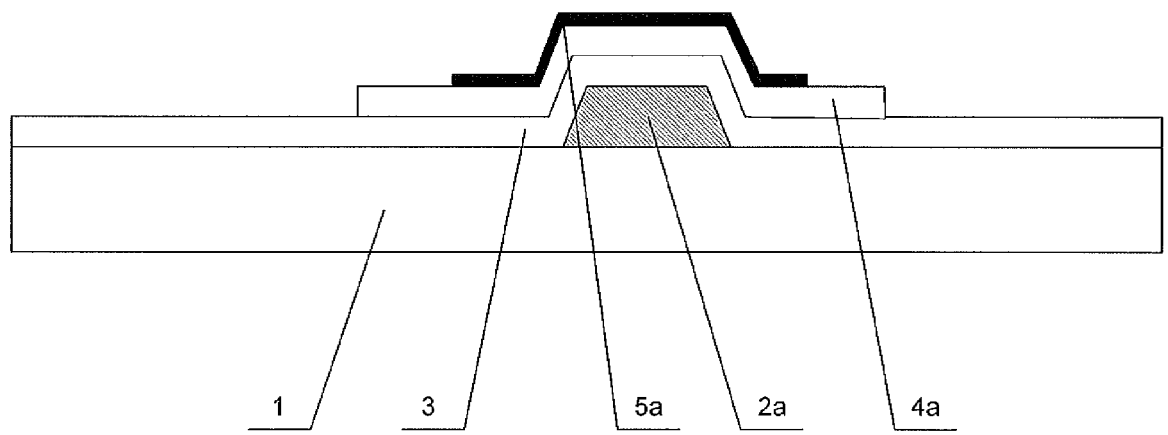
FIG. 4e is a cross sectional view taken along line B-B in FIG. 4d.

The array substrate shown in FIG. 4c is subjected to a second etching to remove the barrier layer in the region HP, exposing the semiconductor layer. Then the photoresist is removed, thus obtaining the barrier layer pattern 5a in the second patterning process, as shown in FIGS. 4d and 4e. FIG. 4d is a plan view showing the array substrate of the TFT-LCD after the second patterning process according to the first embodiment of present invention. FIG. 4e is a cross sectional view taken along line B-B in FIG. 4d.

In the step 103, the ohmic contact layer 6 is deposited on the resultant structure of step 102 by PECVD process. The reaction gas may be a gas mixture of $SiH_4$, $PH_3$, $H_2$ or a gas mixture of $SiH_2Cl_2$, $PH_3$, $H_2$. And the transparent conductive layer 7 and the source drain metal layer 8 are deposited by sputtering or thermal evaporation. The material of the transparent conductive layer 7 is typically indium tin oxide (ITO), it can also be other metals and metal oxides. The material of the source drain metal layer can be selected from metals such as Cr, W, Ti, Ta, Mo, Al, Cu or alloy thereof, and it can be in a form of a single layer or a multilayer.

Figure 5A:
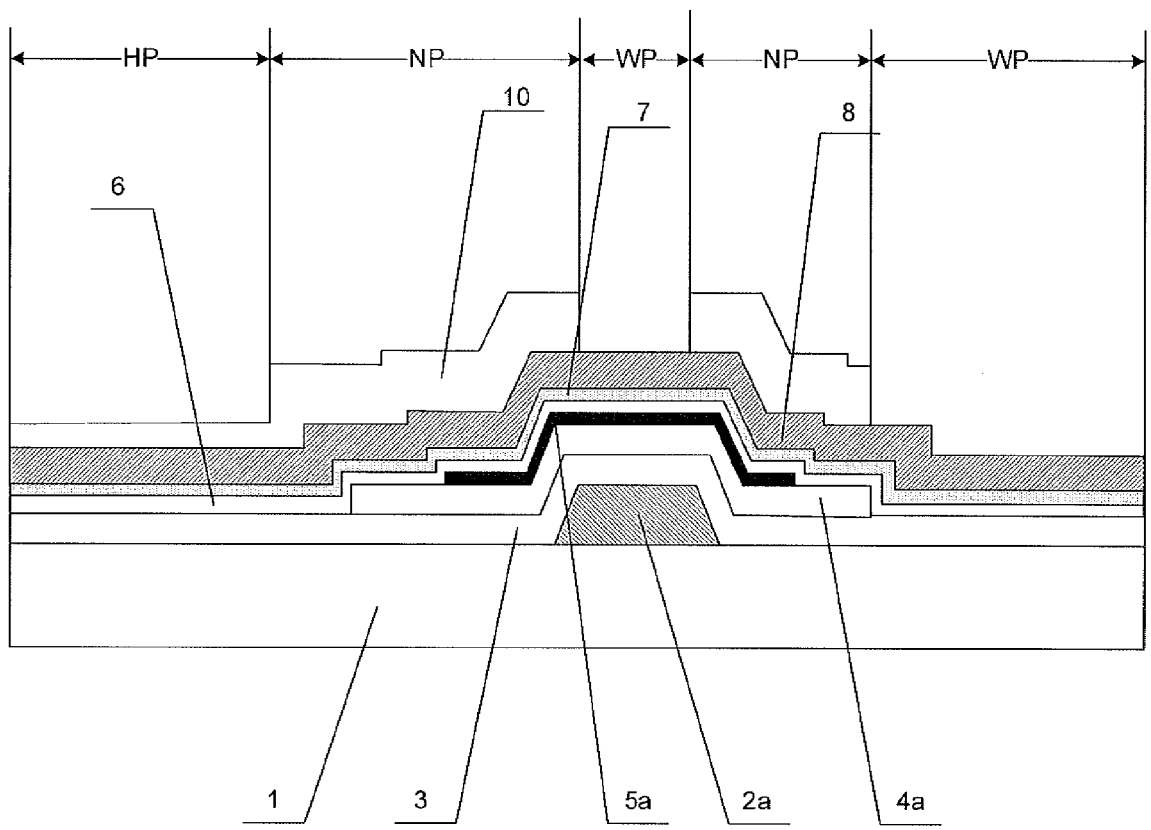
FIG. 5a is a cross sectional view showing the array substrate of the TFT-LCD after exposing and developing using a half tone or gray tone mask in a third patterning process according to the first embodiment of present invention.

Next, the photoresist layer 10 is applied, and exposed and developed using a half tone mask. FIG. 5a is a cross sectional view showing the array substrate of the TFT-LCD after exposing and developing using the half tone or gray tone mask in a third patterning process according to the first embodiment of present invention. As shown in FIG. 5a, region WP refers to a region in which the photoresist is completely removed, a region HP refers to a region in which the photoresist is partially remained, and a region NP refers to a region in which the photoresist is kept intact. The region NP corresponds to a region to be formed with the source electrode, the drain electrode and the data line, the region HP corresponds to the region to be formed with the pixel electrode, and the region HP corresponds to the region other than the region NP and the region WP.

Figure 5B:
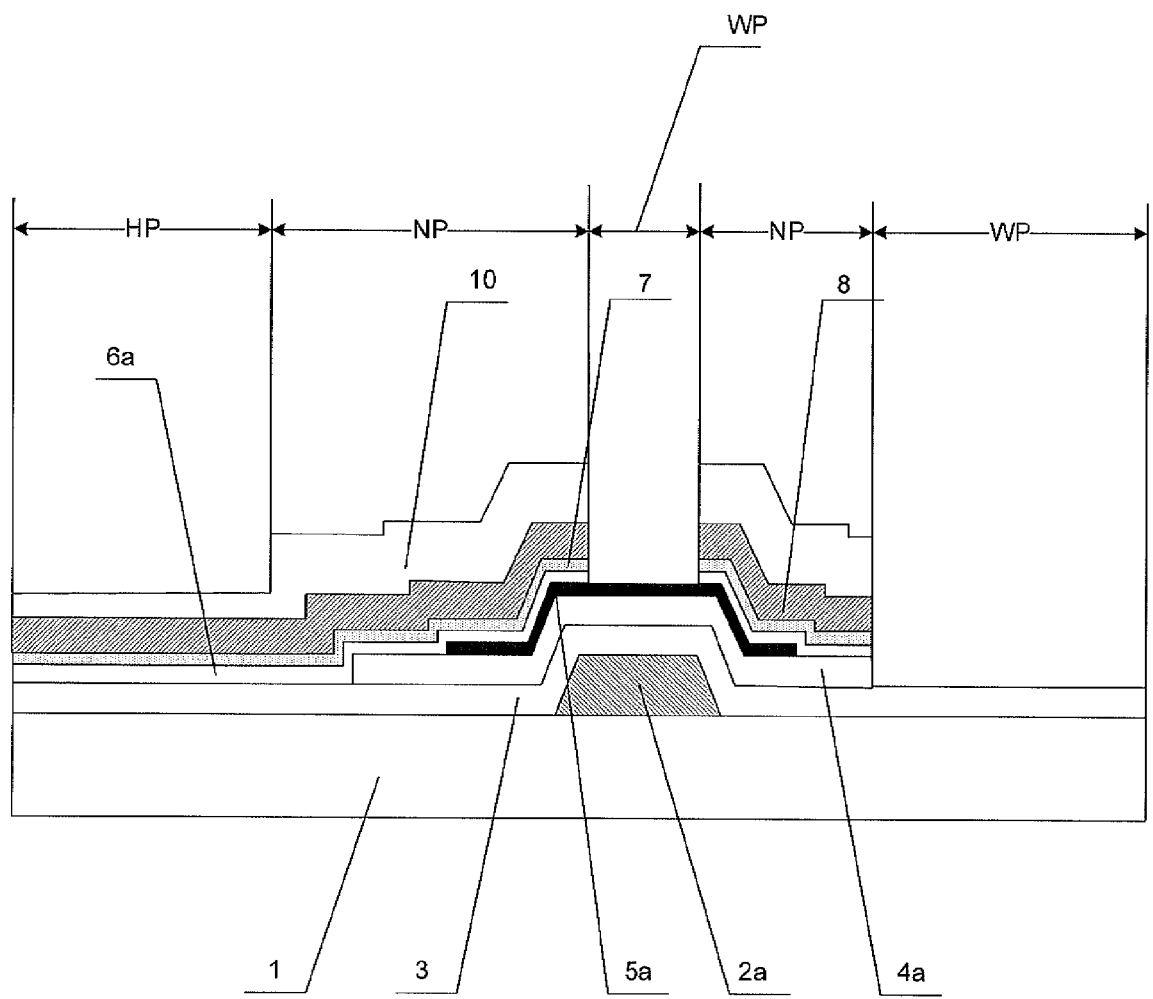
FIG. 5b is a cross sectional view showing the array substrate of the TFT-LCD after a first etching in the third patterning process according to the first embodiment of present invention.

The array substrate shown in FIG. 5a is subjected to a first etching so as to remove the source drain metal layer, the transparent conductive layer and the ohmic contact layer in the region WP, thus forming the ohmic contact layer pattern 6a, the data line and the TFT channel. FIG. 5b is a cross sectional view showing the array substrate of the TFT-LCD after the first etching in the third patterning process according to the first embodiment of present invention.

Figure 5C:
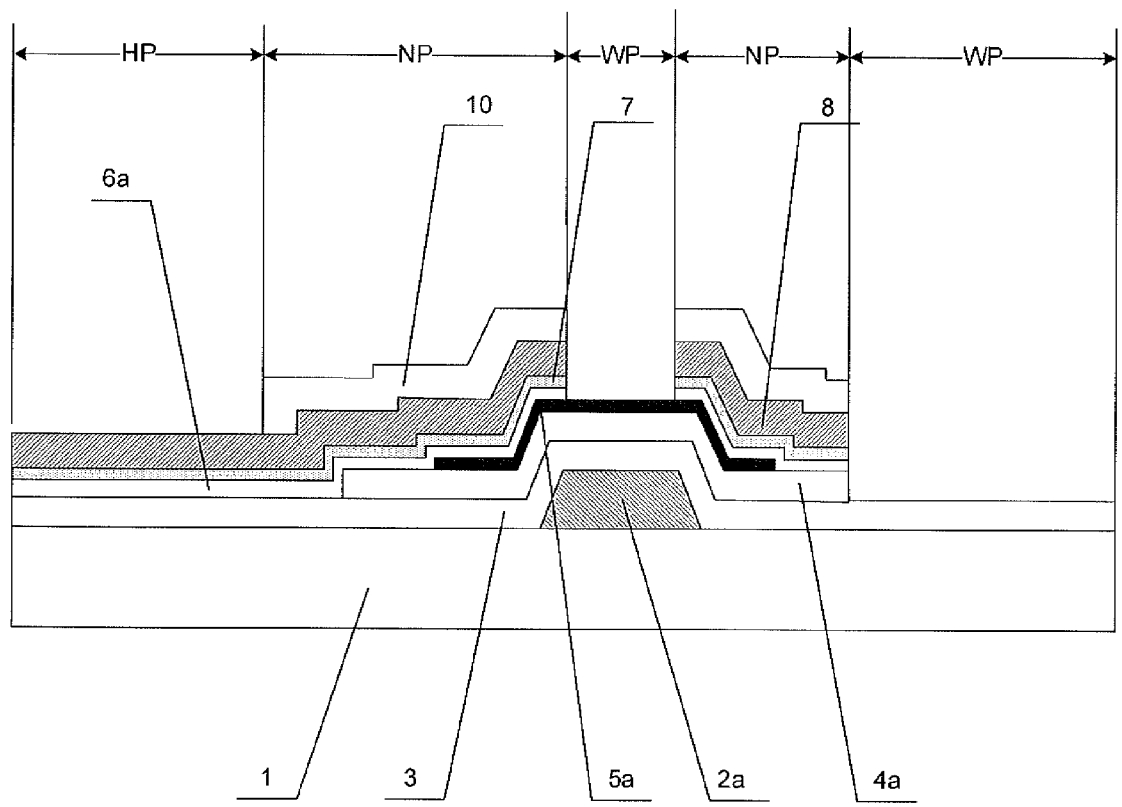
FIG. 5c is a cross sectional view showing the array substrate of the TFT-LCD after ashing in the third patterning process according to the first embodiment of present invention.

Then, the photoresist on the array substrate is subjected to an ashing process to remove the photoresist in the region HP, as shown in FIG. 5c which is a cross sectional view showing the array substrate of the TFT-LCD after ashing in the third patterning process according to the first embodiment of present invention.

Figure 5D:
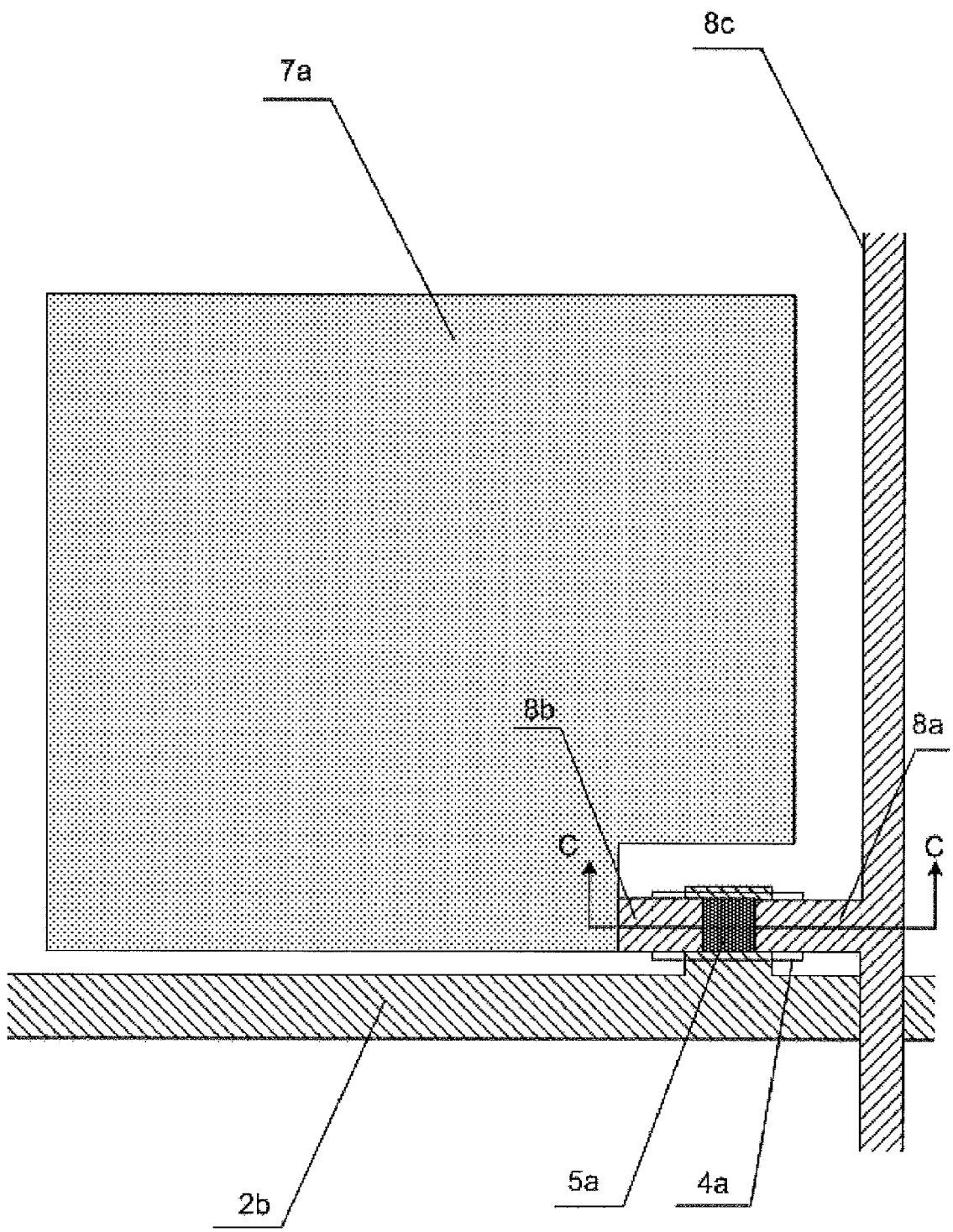
FIG. 5d is a plan view showing the array substrate of the TFT-LCD after the third patterning process according to the first embodiment of present invention.
Figure 5E:
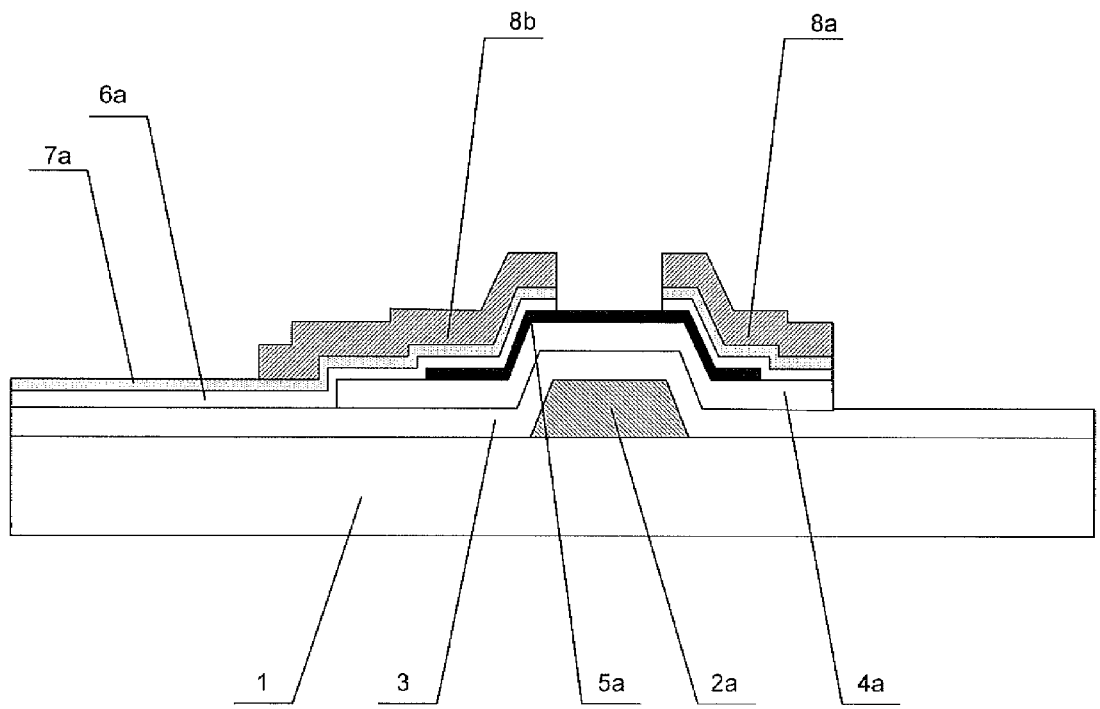
FIG. 5e is a cross sectional view taken along line C-C in FIG. 5d.

The array substrate shown in FIG. 5c is subject to a second etching so as to remove the source drain layer in the region HP, and then the photoresist is removed, thus obtaining the transparent pixel electrode 7a, the source electrode 8a, the drain electrode 8b and the data line 8c in the third patterning process, as shown in FIGS. 5d and 5e. FIG. 5d is a plan view showing the array substrate of the TFT-LCD after the third patterning process according to the first embodiment of present invention (FIG. 5d does not show the gate line PAD region and the data line PAD region). FIG. 5e is a cross sectional view taken along line C-C in FIG. 5d.

Figure 6:
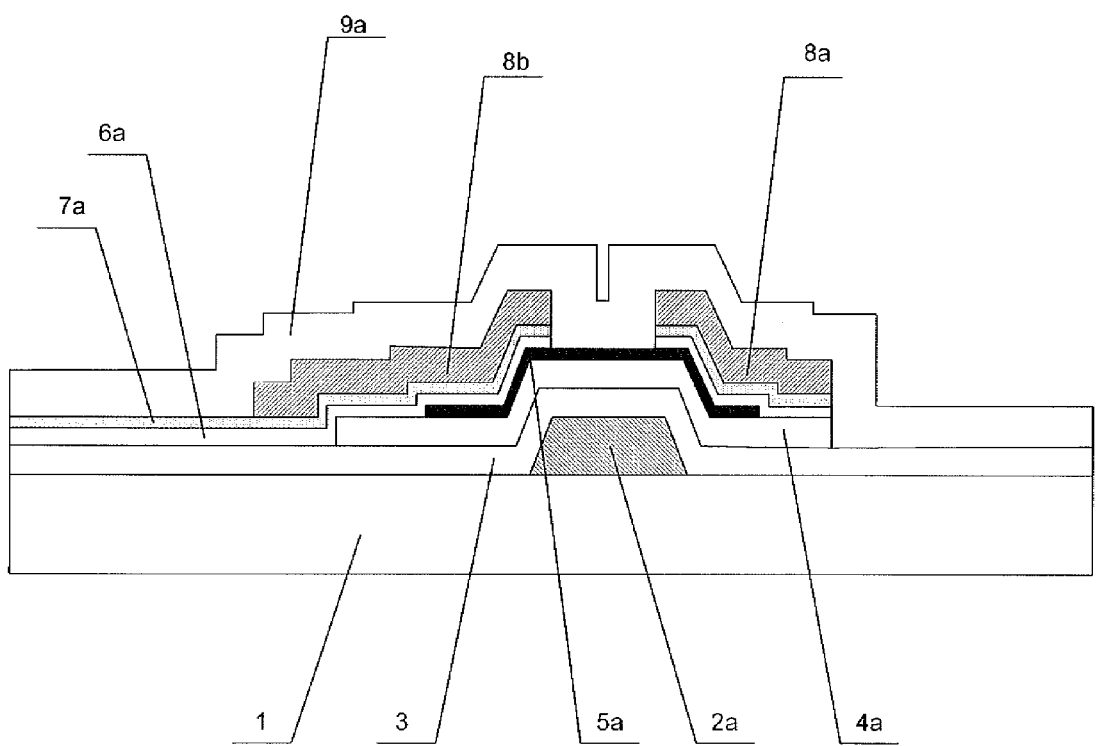
FIG. 6 is a cross sectional view showing the array substrate of the TFT-LCD after a fourth patterning process according to the first embodiment of present invention.

In the step 104, a passivation layer is deposited on the resultant structure of step 103, as shown in FIG. 6 which is a cross sectional view showing the array substrate of the TFT-LCD after a fourth patterning process according to the first embodiment of present invention. The plan view of the array substrate after step 104 is the same as that shown in FIG. 5d. Furthermore, a fourth patterning process is required to completely remove the passivation layer on the data line PAD region and the gate line PAD region, exposing the metal layer on the data line PAD region and the gate line PAD region, so as to form a passivation layer pattern 9a. The data line PAD region and the gate line PAD region can be formed by typical methods in the art, thus detailed description is omitted.

Figure 7:
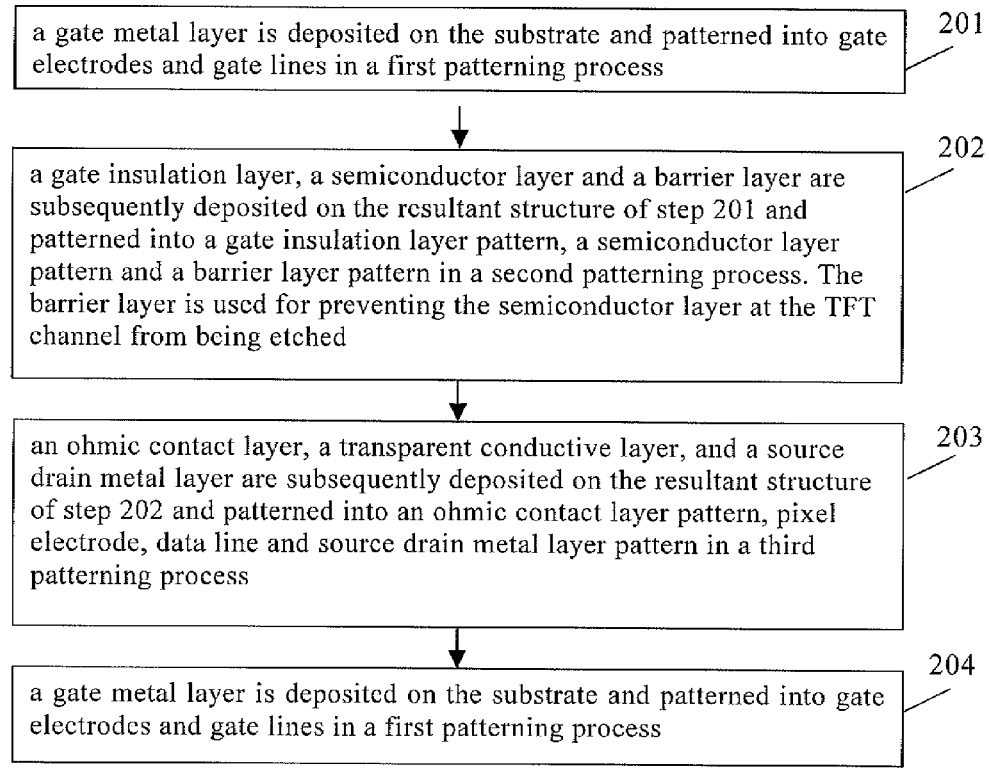
FIG. 7 is a flow chart of a method of manufacture of the array substrate of the TFT-LCD according to a second embodiment of the present invention.

FIG. 7 is a flow chart of a method of manufacture of the array substrate of the TFT-LCD according to a second embodiment of the present invention. The method includes the following steps.

In step 201, a gate metal layer is deposited on the substrate and patterned into gate electrodes and gate lines in a first patterning process.

In step 202, a gate insulation layer, a semiconductor layer and a barrier layer are subsequently deposited on the resultant structure of step 201 and patterned into a gate insulation layer pattern, a semiconductor layer pattern and a barrier layer pattern in a second patterning process. The barrier layer is used for preventing the semiconductor layer at the TFT channel from being etched.

In step 203, an ohmic contact layer, a transparent conductive layer, and a source drain metal layer are subsequently deposited on the resultant structure of step 202 and patterned into the ohmic contact layer pattern, pixel electrode, data line and source drain metal layer pattern in a third patterning process.

In step 204, a passivation layer is deposited on the resultant structure of step 203 so as to form the source electrode, the drain electrode and the TFT channel.

In the second embodiment, the step of forming the gate electrode and the gate line in the first patterning process, and the step of forming the semiconductor layer pattern and the barrier layer pattern in the second patterning process are the same as those in the first embodiment. The second embodiment is different from the first embodiment regarding the third patterning and fourth patterning process, which are described in more detail as below.

In the step 203, an ohmic contact layer 6 is deposited on the resultant structure of step 102 by PECVD, in which the reaction gas may be selected from a gas mixture of $SiH_4$, $PH_3$, $H_2$ or a gas mixture of $SiH_2Cl_2$, $PH_3$, $H_2$. Then a transparent conductive layer 7 and a source drain metal layer 8 are deposited by sputtering or thermal evaporation method. The material of the transparent conductive layer 7 is typically indium tin oxide (ITO). It can also be other metals and metal oxides. The material of the source drain metal layer can be selected from metals such as Cr, W, Ti, Ta, Mo, Al, Cu or alloy thereof, and it can be in a form of a single layer or a multilayer.

Figure 8A:
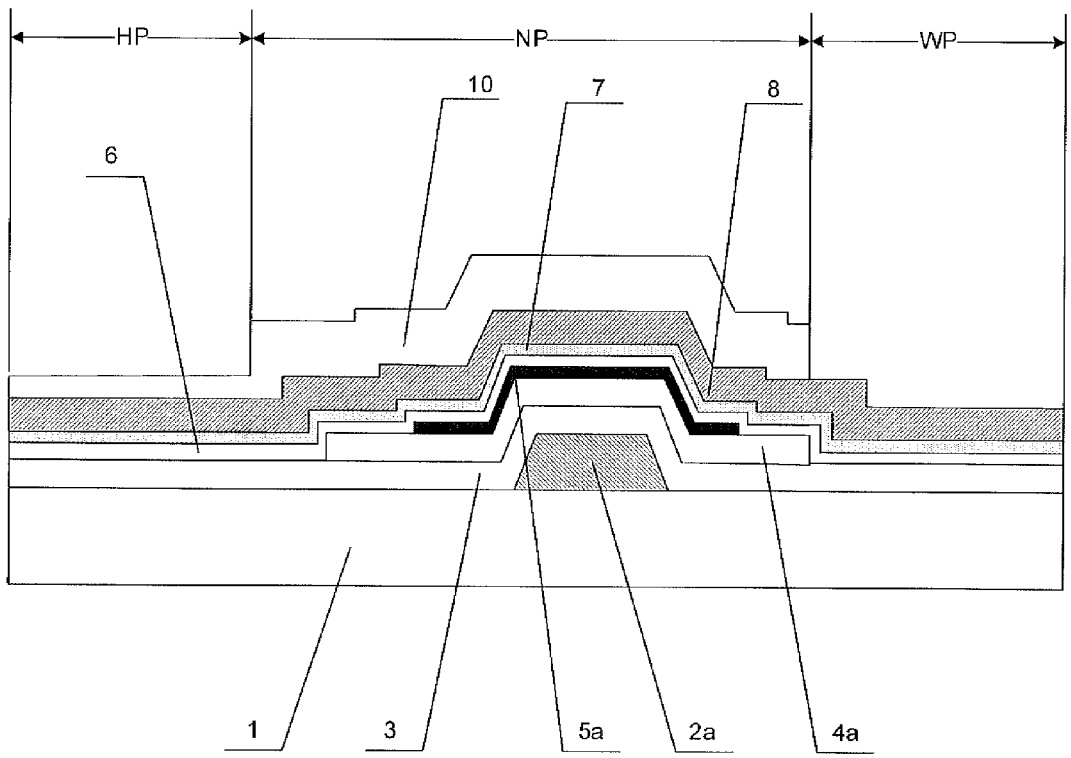
FIG. 8a is a cross sectional view showing the array substrate of the TFT-LCD after exposing and developing using a half tone or gray tone mask in a third patterning process according to the second embodiment of present invention.

Next, the photoresist layer 10 is applied and exposed and developed using a half tone mask, as shown in FIG. 8a which is a cross sectional view showing the array substrate of the TFT-LCD after exposing and developing using the half tone or gray tone mask in a third patterning process according to the second embodiment of present invention. As shown in FIG. 8a, a region WP refers to a region in which the photoresist is completely removed, a region HP refers to a region in which the photoresist is partially remained, and region NP refers to a region in which the photoresist is kept intact. The region NP corresponds to a region to be formed with the source drain metal layer pattern and the data line, the region HP corresponds to a region to be formed with the pixel electrode, and the region HP corresponds to a region other than the region NP and the region WP.

Figure 8B:
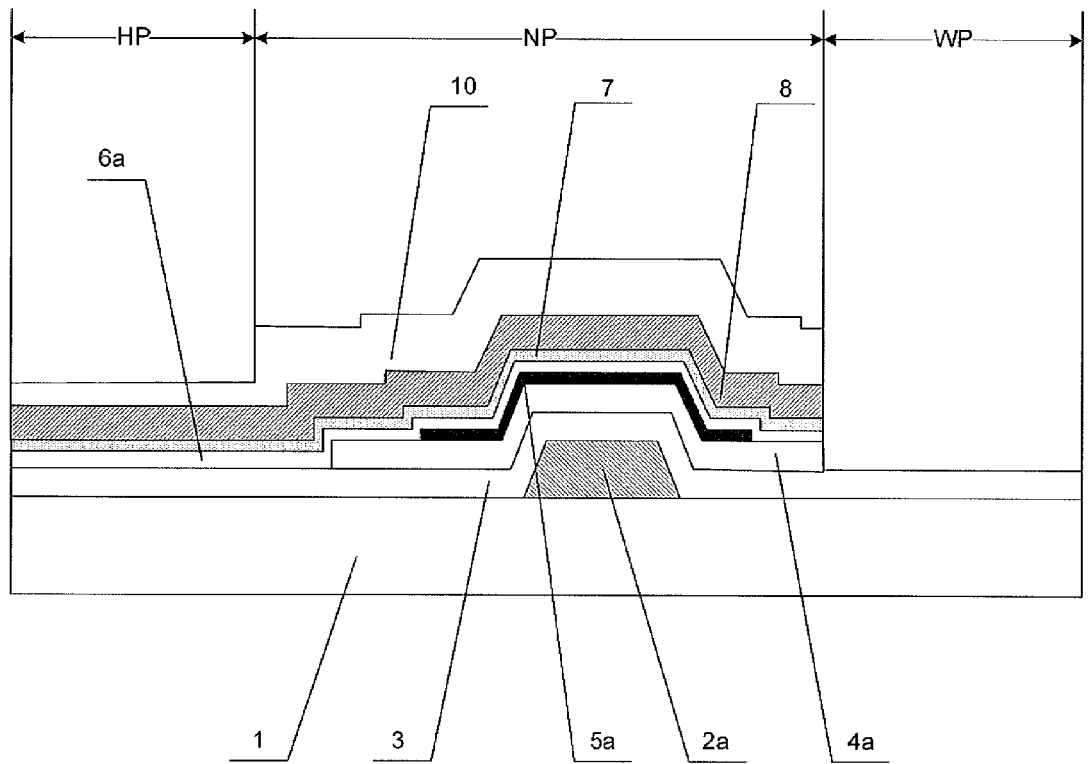
FIG. 8b is a cross sectional view showing the array substrate of the TFT-LCD after a first etching in the third patterning process according to the second embodiment of present invention.

The array substrate shown in FIG. 8a is subjected to a first etching so as to remove the source drain metal layer, the transparent conductive layer and the ohmic contact layer in the region WP, thus forming the data line and the ohmic contact layer pattern 6a, as shown in FIG. 8b which is a cross sectional view showing the array substrate of the TFT-LCD after a first etching in the third patterning process according to the second embodiment of present invention.

Figure 8C:
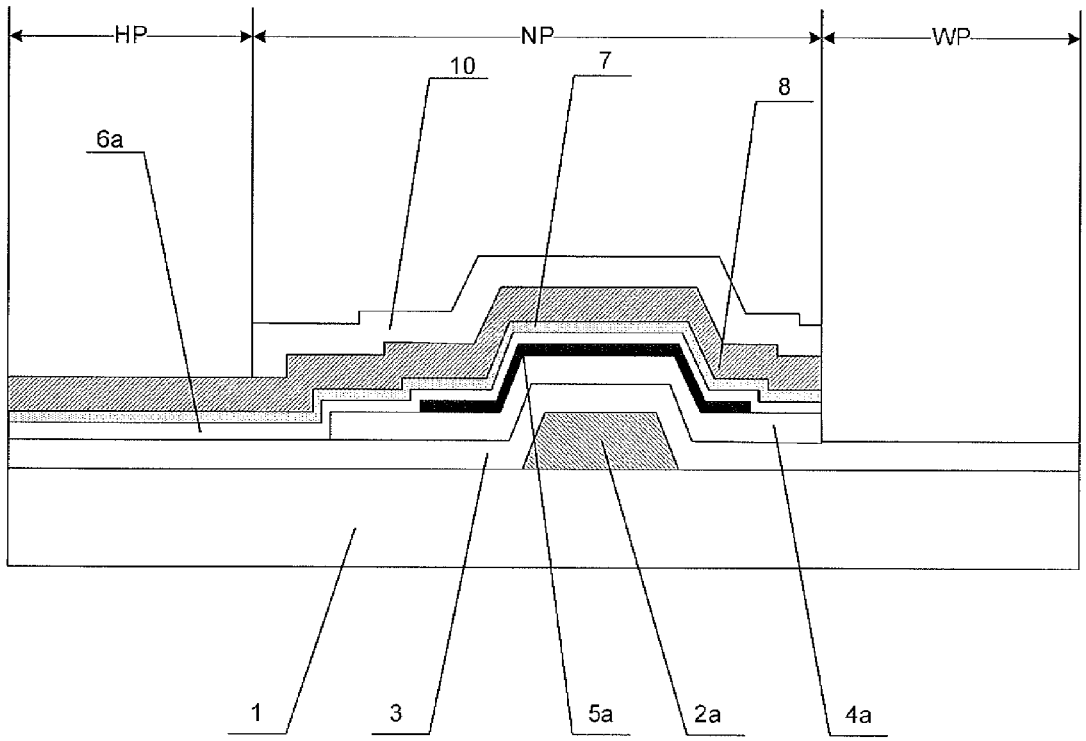
FIG. 8c is a cross sectional view showing the array substrate of the TFT-LCD after ashing in the third patterning process according to the second embodiment of present invention.
Figure 8D:
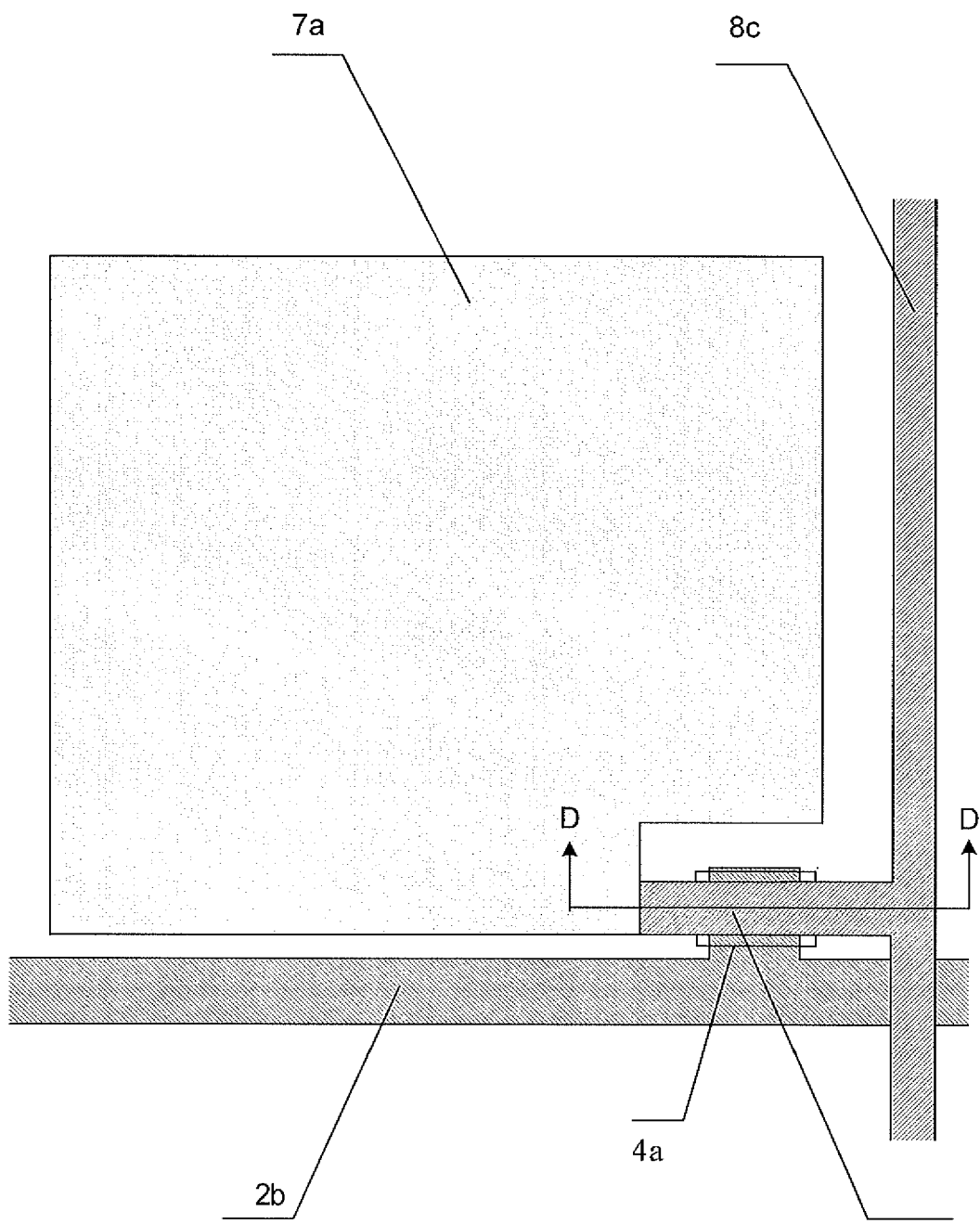
FIG. 8d is a plan view showing the array substrate of the TFT-LCD after the third patterning process according to the second embodiment of present invention.
Figure 8E:
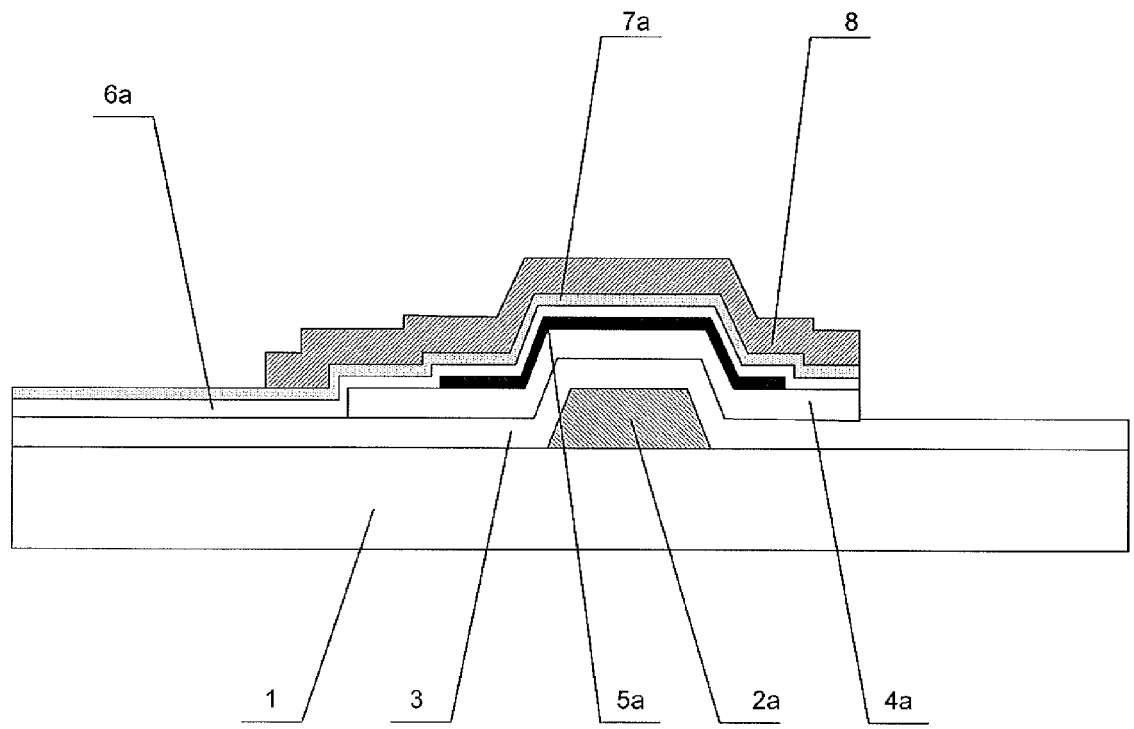
FIG. 8e is a cross sectional view taken along line D-D in FIG. 8d.

Then, the photoresist on the array substrate is subjected to ashing so as to remove the photoresist in the region HP, as shown in FIG. 8c which is a cross sectional view showing the array substrate of the TFT-LCD after ashing in the third patterning process according to the second embodiment of present invention;

The array substrate shown in FIG. 8c is subjected to a second etching so as to remove the source drain metal layer 8 in the region HP, thus obtaining the transparent pixel electrode 7a, the source drain metal layer pattern 8d in the third patterning process, as shown in FIGS. 8d and 8e. FIG. 8d is a plan view showing the array substrate of the TFT-LCD after the third patterning process according to the second embodiment of present invention. FIG. 8e is a cross sectional view taken along line D-D in FIG. 8d.

Figure 9A:
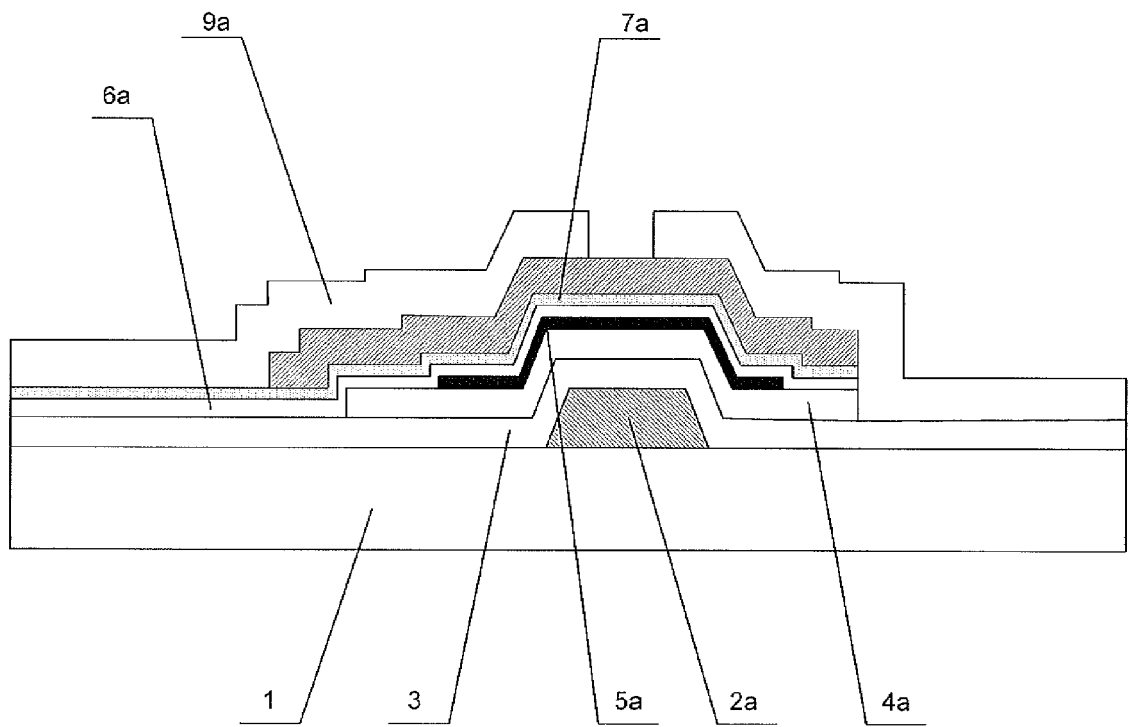
FIG. 9a is a cross sectional view showing the array substrate of the TFT-LCD after exposing and developing using an ordinary mask in a fourth patterning process according to the second embodiment of present invention.

In the step 204, the passivation layer is deposited on the resultant structure of step 203 by PECVD. The material of the passivation layer can be selected from oxide, nitride and oxynitride. The corresponding reaction gas may be selected from a gas mixture of $SiH_4$, $NH_3$, $N_2$ or a gas mixture of $SiH_2Cl_2$, $NH_3$, $N_2$. Then the passivation layer is patterned into a passivation layer pattern 9a using an ordinary mask, as shown in FIG. 9a which is a cross sectional view showing the array substrate of the TFT-LCD after exposing and developing using an ordinary mask in a fourth patterning process according to the second embodiment of present invention.

Figure 9B:
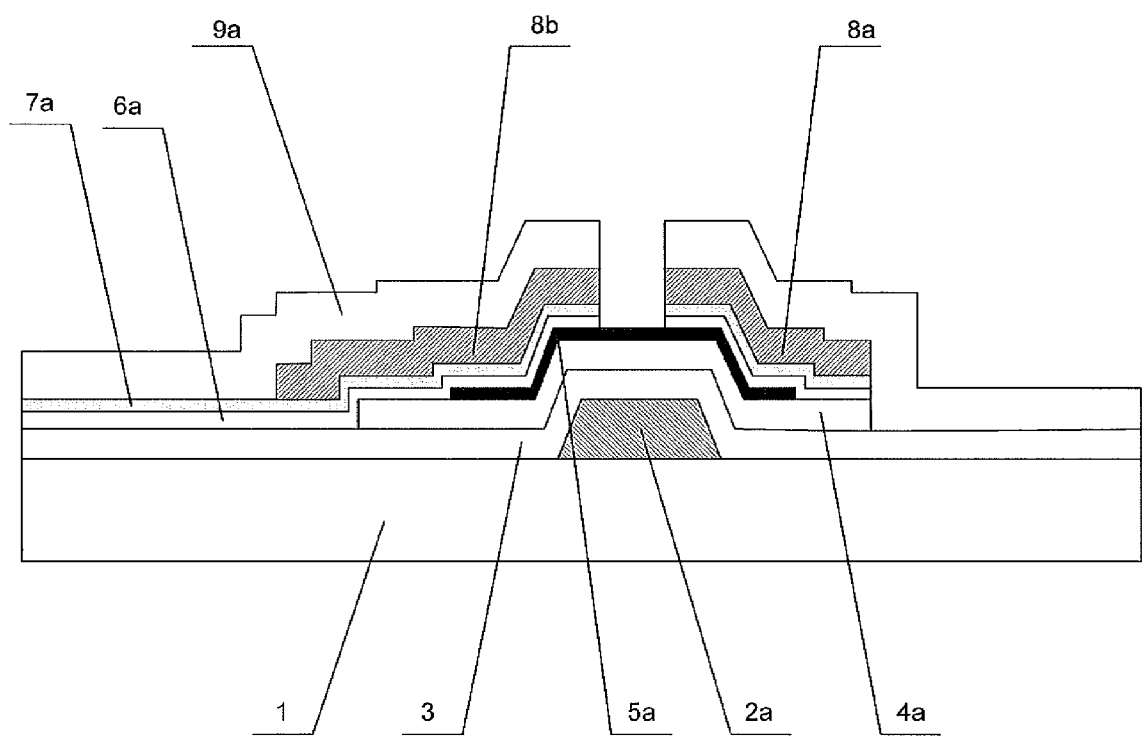
FIG. 9b is a cross sectional view showing the array substrate of the TFT-LCD after the fourth patterning process according to the second embodiment of present invention.

The source drain metal layer at the TFT channel, the transparent conductive layer and the ohmic contact layer are etched in an etching process so as to form the source electrode 8a, the drain electrode 8b and the TFT channel, and form a data line PAD region and a gate line PAD region, as shown in FIG. 9b which is a cross sectional view showing the array substrate of the TFT-LCD after the fourth patterning process according to the second embodiment of present invention. In the step 204, the passivation layer in the data line PAD region and the gate line PAD region are removed, so as to expose the metal layer in the data line PAD region and the gate line PAD region.

The plan view of an embodiment of the array substrate of TFT-LCD according to present invention is shown in FIG. 5d, and the cross sectional view of the same can be shown in FIG. 9b or FIG. 6. The array substrate according to embodiments of the present invention comprising the substrate, gate lines, the gate electrode, the gate insulation layer, the semiconductor layer, the ohmic contact layer, pixel electrode, the source electrode, the drain electrode and data lines is different from the conventional array substrate in that a barrier layer is disposed between the semiconductor layer and the ohmic contact layer for preventing the semiconductor layer at the TFT channel from being etched. In this way, the semiconductor layer can be made thinner. In the conventional four masks process, the semiconductor layer should be over etched when the TFT channel is formed, and the semiconductor typically has a thickness of 100-300 nm. However, due to the barrier layer in the embodiment of the present invention, the thickness of the semiconductor can be reduced to 40-100 nm, thus reducing the off-state current and increasing the retention time of the charge at the pixel electrode, which in turn improving TFT performance. Also, since the barrier layer is disposed between the ohmic contact layer and the semiconductor layer, and the area of the barrier layer is smaller than the area of the semiconductor layer, the barrier layer will not affect the contact between the ohmic contact layer and the semiconductor layer.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. An array substrate of thin film transistor liquid crystal display (TFT-LCD) comprising gate lines and data lines, in which pixel electrodes and thin film transistors are formed within the pixel region defined by the gate lines and the data lines, wherein a barrier layer pattern is disposed between a semiconductor layer pattern and an ohmic contact layer pattern in the thin film transistor for preventing the semiconductor layer pattern from being etched, wherein an area of the barrier layer pattern is smaller than an area of the semiconductor layer pattern so that the ohmic contact layer pattern is in contact with the semiconductor layer pattern.

2. The array substrate of TFT-LCD according to claim 1, wherein the semiconductor layer pattern is formed on the gate insulation layer, the ohmic contact layer pattern is formed on the gate insulation layer; the semiconductor layer pattern and the barrier layer pattern, the pixel electrode is disposed on the ohmic contact layer pattern; the drain electrode is disposed on the pixel electrode; a TFT channel is formed between the source electrode and the drain electrode; the source electrode is connected to the data line.

3. The array substrate of TFT-LCD according to claim 2, wherein the gate insulation layer, the semiconductor layer pattern and the barrier layer pattern are formed in a first patterning process;
   the ohmic contact layer, the pixel electrode, the source electrode, the drain electrode, the TFT channel and the data line are patterned in a second patterning process; and
   a passivation layer is disposed on the pixel electrode, the source electrode, the drain electrode, the TFT channel, the data line.

4. The array substrate of TFT-LCD according to claim 3, wherein the thickness of the barrier layer pattern is 100-300 nm.

5. The array substrate of TFT-LCD according to claim 2, wherein the gate insulation layer, the semiconductor layer and the barrier layer are formed in a first patterning process;
   the ohmic contact layer, the pixel electrode and the data line are patterned in a second patterning process;
   the source electrode, the drain electrode, the TFT channel and the passivation layer are patterned in a third patterning process; and
   the passivation layer is disposed on the pixel electrode, the source electrode, the drain electrode and the data line.

6. The array substrate of TFT-LCD according to claim 5, wherein the thickness of the barrier layer pattern is 100-300 nm.

7. The array substrate of TFT-LCD according to claim 2, wherein the thickness of the barrier layer pattern is 100-300 nm.

8. The array substrate of TFT-LCD according to claim 7, wherein the thickness of the semiconductor layer pattern is 40-100 nm.

9. The array substrate of TFT-LCD according to claim 1, wherein the thickness of the barrier layer pattern is 100-300 nm.

10. The array substrate of TFT-LCD according to claim 9, wherein the thickness of the semiconductor layer pattern is 40-100 nm.

* * * * *